United States Patent
Chito

(10) Patent No.: US 10,665,492 B2
(45) Date of Patent: May 26, 2020

(54) WAFER UNLOADING METHOD

(71) Applicant: DISCO CORPORATION, Tokyo (JP)

(72) Inventor: Kenta Chito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/950,874

(22) Filed: Apr. 11, 2018

(65) Prior Publication Data

US 2018/0301363 A1 Oct. 18, 2018

(30) Foreign Application Priority Data

Apr. 14, 2017 (JP) .................................. 2017-080405

(51) Int. Cl.
*H01L 21/683* (2006.01)
*H01L 21/67* (2006.01)
*H01J 37/32* (2006.01)
*H01L 21/3065* (2006.01)

(52) U.S. Cl.
CPC .... *H01L 21/6833* (2013.01); *H01J 37/32091* (2013.01); *H01J 37/32568* (2013.01); *H01J 37/32816* (2013.01); *H01L 21/3065* (2013.01); *H01L 21/67109* (2013.01); *H01L 21/67248* (2013.01); *H01L 21/6838* (2013.01)

(58) Field of Classification Search
CPC .......................... H01L 21/6833; H01L 21/6838
See application file for complete search history.

(56) References Cited

U.S. PATENT DOCUMENTS

| 5,539,179 | A  | * | 7/1996 | Nozawa | ............... | H01L 21/6831 |
| | | | | | | 219/121.43 |
| 7,813,103 | B2 | * | 10/2010 | Shannon | ........... | H01J 37/32091 |
| | | | | | | 361/234 |
| 2012/0200981 | A1 | * | 8/2012 | Zhang | ................. | H01L 21/6833 |
| | | | | | | 361/212 |
| 2012/0308341 | A1 | * | 12/2012 | Ishizawa | ........... | H01L 21/67742 |
| | | | | | | 414/217 |
| 2016/0276199 | A1 | * | 9/2016 | Iida | ...................... | H01L 21/6833 |
| 2017/0207110 | A1 | * | 7/2017 | Satoh | ................ | H01J 37/32009 |

(Continued)

FOREIGN PATENT DOCUMENTS

DE 102018205547 A1 * 10/2018 ........ H01J 37/32091
JP 2001358097 A 12/2001

*Primary Examiner* — Kaitlin S Joerger
(74) *Attorney, Agent, or Firm* — Greer Burns & Crain Ltd.

(57) ABSTRACT

Disclosed herein is a wafer unloading method for unloading a wafer from an electrostatic chuck table electrostatically holding the wafer by applying a voltage to the electrostatic chuck table. The wafer unloading method includes a voltage application stopping step of stopping the application of the voltage to the electrostatic chuck table electrostatically holding the wafer, a static eliminating voltage applying step of passing a current reverse in direction to a current passed to the electrostatic chuck table for electrostatically holding the wafer after performing the voltage application stopping step, thereby applying a static eliminating voltage for canceling peeling electrification to the electrostatic chuck table, and an unholding step of unholding the wafer from the electrostatic chuck table in the condition where the static eliminating voltage is kept applied to the electrostatic chuck table, after performing the static eliminating voltage applying step.

6 Claims, 4 Drawing Sheets

(56) References Cited

U.S. PATENT DOCUMENTS

2018/0025928 A1* 1/2018 Chito ............... H01J 37/32009
  156/345.28
2019/0066982 A1* 2/2019 Sato ................ H01J 37/32577
2019/0088518 A1* 3/2019 Koh .................. H01L 21/6833

* cited by examiner

WAFER UNLOADING METHOD

BACKGROUND OF THE INVENTION

Field of the Invention

The present invention relates to a wafer unloading method for unloading a wafer from an electrostatic chuck table.

Description of the Related Art

In a plasma etching apparatus for performing plasma etching to a wafer in a vacuum environment, an electrostatic chuck table is used to electrostatically hold the wafer in a vacuum chamber (see Japanese Patent Laid-open No. 2001-358097, for example).

SUMMARY OF THE INVENTION

In unloading the wafer from the electrostatic chuck table electrostatically holding the wafer, peeling electrification occurs between the electrostatic chuck table and the wafer kept in close contact with each other. If static electricity remains in the electrostatic chuck table after unholding the wafer from the electrostatic chuck table, there is a possibility that an electrostatic holding force by the electrostatic chuck table may be reduced in next holding another wafer on the electrostatic chuck table.

It is therefore an object of the present invention to provide a wafer unloading method which can prevent a reduction in electrostatic holding force by the electrostatic chuck table due to peeling electrification.

In accordance with an aspect of the present invention, there is provided a wafer unloading method for unloading a wafer from an electrostatic chuck table electrostatically holding the wafer by applying a voltage to the electrostatic chuck table, the wafer unloading method including a voltage application stopping step of stopping the application of the voltage to the electrostatic chuck table electrostatically holding the wafer; a static eliminating voltage applying step of passing a current reverse in direction to a current passed to the electrostatic chuck table for electrostatically holding the wafer after performing the voltage application stopping step, thereby applying a static eliminating voltage for canceling peeling electrification to the electrostatic chuck table; and an unholding step of unholding the wafer from the electrostatic chuck table in the condition where the static eliminating voltage is being kept applied to the electrostatic chuck table, after performing the static eliminating voltage applying step.

Preferably, the electrostatic chuck table has a holding surface for holding the wafer, an air discharge port opening to the holding surface, and an air passage having one end connected to the air discharge port and the other end connected to an air source; the wafer unloading method further including an air blow step of discharging air from the air discharge port after performing the static eliminating voltage applying step and before performing the unholding step; whereby the air is supplied from the air source through the air passage to the air discharge port and then discharged from the air discharge port toward the wafer held on the holding surface of the electrostatic chuck table.

Preferably, the wafer unloading method further includes a suction pad contact making step of making the contact of a conductive suction pad with the wafer held on the electrostatic chuck table before performing the static eliminating voltage applying step; and a suction holding step of holding the wafer under suction by using the conductive suction pad, after performing the suction pad contact making step and before performing the air blow step.

According to the present invention, the static eliminating voltage for canceling the peeling electrification is applied to the electrostatic chuck table before unholding the wafer from the electrostatic chuck table. Accordingly, the electrostatic chuck table is charged with polarity opposite to that of electric charge produced in peeling electrification, so that the occurrence of peeling electrification in unholding the wafer from the electrostatic chuck table can be prevented. Further, after unholding the wafer from the electrostatic chuck table, the charged condition of the electrostatic chuck table can be canceled. Accordingly, in next holding another wafer on the electrostatic chuck table, a reduction in electrostatic holding force by the electrostatic chuck table can be prevented.

In the case that the electrostatic chuck table has a holding surface for holding the wafer, an air discharge port opening to the holding surface, and an air passage having one end connected to the air discharge port and the other end connected to an air source, and that the wafer unloading method further includes an air blow step of discharging air from the air discharge port after performing the static eliminating voltage applying step and before performing the unholding step as described above, the following effect can be exhibited. That is, the suction force acting between the wafer and the holding surface of the electrostatic chuck table due to vacuum can be removed by the air discharged from the air discharge port. Accordingly, there is no possibility that the wafer may be damaged in unholding the wafer from the electrostatic chuck table.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
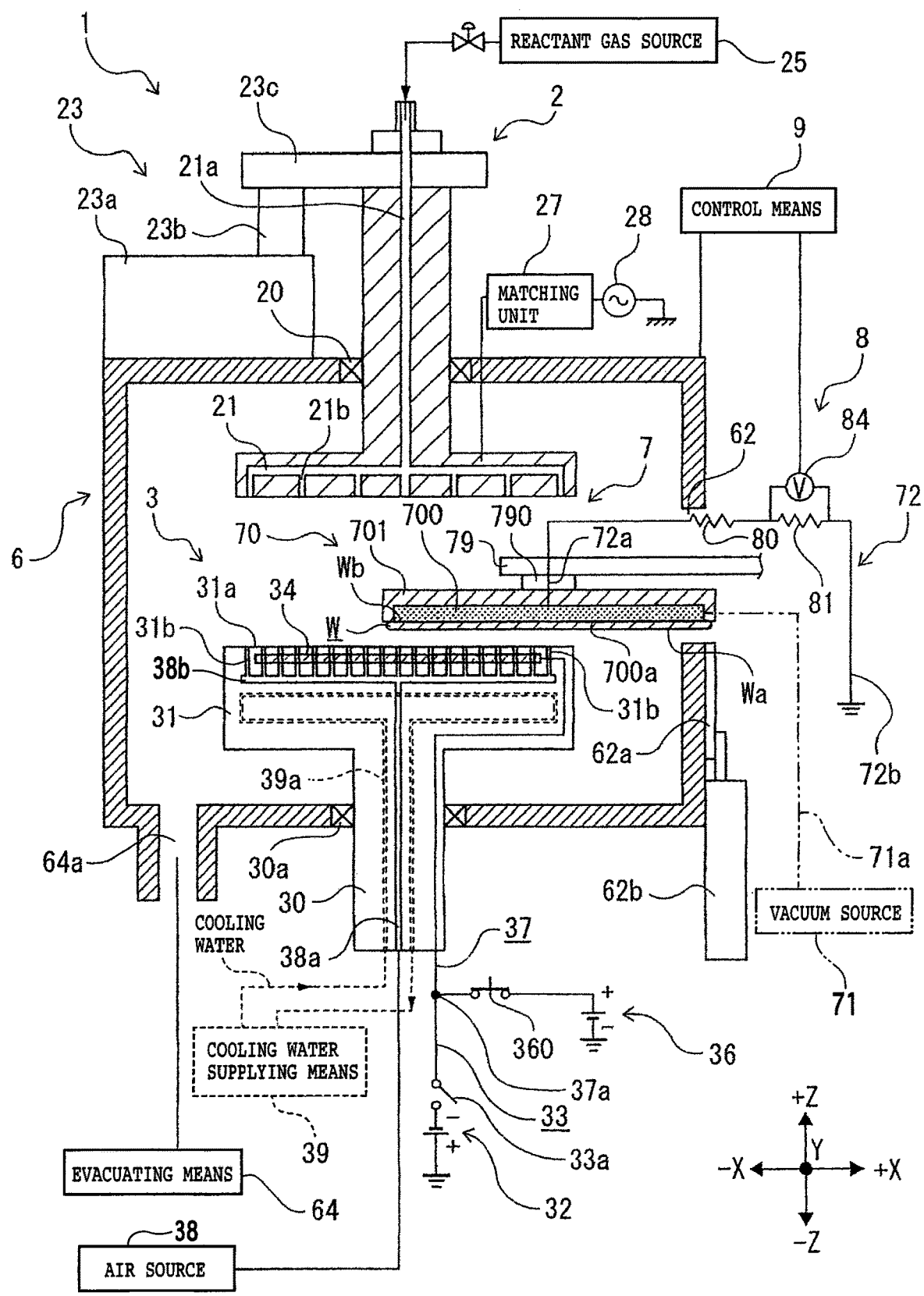
FIG. 1 is a vertical sectional view of a plasma etching apparatus.

Referring to FIG. 1, there is shown a plasma etching apparatus 1 for performing plasma etching to a wafer W in a vacuum environment (under a reduced pressure). The plasma etching apparatus 1 shown in FIG. 1 includes an electrostatic chuck table 3 having a holding surface 31a for holding the wafer W, a vacuum chamber 6 equipped with evacuating means 64 for evacuating the inside space of the vacuum chamber 6 in which the electrostatic chuck table 3 is provided, and transfer means 7 for loading the wafer W into the vacuum chamber 6 and unloading the wafer W out of the vacuum chamber 6.

The electrostatic chuck table 3 includes a shaft portion 30 vertically movably supported through a bearing 30*a* to a lower portion of the vacuum chamber 6 and a wafer holding portion 31 formed of a dielectric such as ceramic (e.g., alumina and titanium oxide). As shown in FIG. 1, the electrostatic chuck table 3 has a substantially T-shaped configuration as viewed in vertical section. The wafer holding portion 31 is a disk-shaped portion, and it is integrally connected to the upper end of the shaft portion 30. That is, the wafer holding portion 31 is integral with the shaft portion 30. The upper surface of the wafer holding portion 31 functions as the holding surface 31*a* formed of a dielectric for holding the wafer W. The wafer holding portion 31 may be configured by forming a dielectric film such as a ceramic film on a separate base.

As shown by a broken line, a cooling water passage 39*a* for passing a cooling water is formed inside the shaft portion 30 and the wafer holding portion 31. Cooling water supplying means 39 is connected to the cooling water passage 39*a*, so as to supply a cooling water to the cooling water passage 39*a* and thereby cool the inside of the electrostatic chuck table 3. In the case that a protective tape (not shown) is attached to the wafer W as a workpiece to be processed, the cooling water supplied from the cooling water supplying means 39 can maintain the temperature of the holding surface 31*a* of the electrostatic chuck table 3 at a temperature such that no gas is generated from the protective tape during plasma etching.

A metal plate 34 as an electrode for generating electric charge by applying a voltage is embedded in the electrostatic chuck table 3. The metal plate 34 is a circular plate provided parallel to the holding surface 31*a*. The metal plate 34 is connected through first wiring 37 to the plus terminal of a direct current (DC) power source 36. Accordingly, when a high DC voltage is applied from the DC power source 36 to the metal plate 34, electric charge (static electricity) due to polarization is generated on the holding surface 31*a*, so that the wafer W can be electrostatically held on the holding surface 31*a* by a Coulomb force.

Second wiring 33 is connected at one end thereof to a connection point 37*a* of the first wiring 37 shown in FIG. 1. A switch 360 is provided on the first wiring 37 between the connection point 37*a* and the DC power source 36. Further, a switch 33*a* is provided on the second wiring 33. The other end of the second wiring 33 is connected to the minus terminal of a DC power source 32.

As shown in FIG. 1, an air passage 38*a* is formed in the shaft portion 30 and the wafer holding portion 31. One end (upper end) of the air passage 38*a* is branched into a plurality of radial passages 38*b* in the wafer holding portion 31 so as to extend radially outward. An air source 38 composed of a vacuum generating apparatus and a compressor is connected to the other end (lower end) of the air passage 38*a*.

A plurality of air discharge ports 31*b* extend from each radial passage 38*b* and open to the holding surface 31*a* of the electrostatic chuck table 3. Each air discharge port 31*b* extends through the metal plate 34 in the thickness direction thereof (Z direction). Thus, the upper end of each air discharge port 31*b* opens to the holding surface 31*a* of the electrostatic chuck table 3, and the lower end of each air discharge port 31*b* is connected to each radial passage 38*b* branched from the air passage 38*a*.

A gas discharge head 2 for discharging a reactant gas is vertically movably supported through a bearing 20 to an upper portion of the vacuum chamber 6. A gas diffusion space 21 is defined inside the gas discharge head 2. A gas inlet passage 21*a* is connected to an upper portion of the gas diffusion space 21, and a plurality of gas outlet passages 21*b* are connected to a lower portion of the gas diffusion space 21. The lower end of each gas outlet passage 21*b* opens to the lower surface of the gas discharge head 2 so as to be directed toward the electrostatic chuck table 3.

An air cylinder 23 is connected to the gas discharge head 2, so as to vertically move the gas discharge head 2. The air cylinder 23 includes a cylinder tube 23*a* containing a piston (not shown) and having a bottom at the lower end (at a base end in the −Z direction) which is fixed to the upper surface of the vacuum chamber 6, a piston rod 23*b* inserted in the cylinder tube 23*a* and having one end (lower end) fixed to the piston, and a connecting member 23*c* fixed to the other end (upper end) of the piston rod 23*b* for supporting the gas discharge head 2. When air is supplied to the cylinder tube 23*a* or discharged from the cylinder tube 23*a*, the pressure inside the cylinder tube 23*a* is changed to thereby vertically move the piston rod 23*b* in the Z direction. As a result, the gas discharge head 2 is vertically moved.

A reactant gas source 25 is connected to the gas inlet passage 21*a* formed inside the gas discharge head 2. For example, the reactant gas source 25 contains a fluorine-based gas such as $SF_6$, $CF_4$, $C_2F_6$, and $C_2F_4$ as the reactant gas. In addition to the reactant gas source 25, an assist gas source (not shown) containing an assist gas for assisting a plasma etching reaction may be connected to the gas inlet passage 21*a*. In this case, a rare gas such as Ar and He is contained as the assist gas in the assist gas source.

A radio frequency (RF) power source 28 is connected through a matching unit 27 to the gas discharge head 2. By supplying an RF power from the RF power source 28 through the matching unit 27 to the gas discharge head 2, the gas discharged from the gas outlet passages 21*b* can be dissociated to form a plasma.

The vacuum chamber 6 has a side wall portion formed with a load/unload opening 62 for loading and unloading the wafer W. A shutter 62*a* for closing the load/unload opening 62 is movably provided on the outer surface of the side wall portion of the vacuum chamber 6. The shutter 62*a* is adapted to be vertically moved by shutter moving means 62*b* such as an air cylinder.

The lower portion of the vacuum chamber 6 is formed with an evacuation opening 64*a*, which is connected to the evacuating means 64 for reducing the pressure inside the vacuum chamber 6. Accordingly, by operating the evacuating means 64, the pressure inside the vacuum chamber 6 can be reduced to a predetermined degree of vacuum.

The transfer means 7 shown in FIG. 1 includes a suction pad 70 having a circular outside shape, for example. The suction pad 70 includes a suction holding member 700 for holding the wafer W under suction, the suction holding member 700 being formed of a conductive porous material such as carbon porous material and metal porous material, and a frame member 701 for supporting the suction holding member 700. A suction line 71*a* is connected at one end thereof to the suction holding member 700. The other end of the suction line 71*a* is connected to a vacuum source 71 such as a vacuum generating apparatus and a compressor. The suction holding member 700 has a lower surface as a conductive holding surface 700*a*, which is an exposed surface flush with the lower surface of the frame member 701. When the vacuum source 71 is operated to generate a suction force, this suction force is transmitted through the suction line 71a to the holding surface 700a of the suction holding member 700, so that the wafer W can be held under suction by the holding surface 700a of the suction holding member 700 included in the suction pad 70.

A connecting member 790 is fixed at a lower end thereof to the upper surface of the frame member 701 of the suction pad 70, and an arm 79 is fixed at one end portion thereof to the upper end of the connecting member 790. That is, the upper end of the connecting member 790 is fixed to the lower surface of the arm 79. Accordingly, the suction pad 70 is fixed through the connecting member 790 to the arm 79. The arm 79 is movable or rotatable in a horizontal plane and also vertically movable in the Z direction.

The transfer means 7 further includes third wiring 72 for connecting the suction pad 70 to the ground. The third wiring 72 is grounded at one end 72b and connected at the other end 72a to the suction holding member 700 of the suction pad 70.

As shown in FIG. 1, a resistor 80 and a resistor 81 are connected in series with the third wiring 72, and a voltmeter 84 for measuring a voltage across the resistor 81 is connected in parallel to the resistor 81. The resistors 80 and 81 and the voltmeter 84 constitute voltage measuring means 8.

As shown in FIG. 1, the plasma etching apparatus 1 includes control means 9 configured by a central processing unit (CPU), storage element such as memory, etc. The control means 9 controls various etching conditions including the amount of an etching gas to be discharged, the time duration of discharge of the etching gas, and the RF power to be applied.

The operation of the plasma etching apparatus 1 shown in FIG. 1 will now be described in the case of performing plasma etching to the wafer W in a vacuum environment after holding the wafer W on the electrostatic chuck table 3. For example, the wafer W is a semiconductor wafer having a circular outside shape. The wafer W has a front side Wa on which a plurality of devices are previously formed and a back side Wb opposite to the front side Wa. The back side Wb of the wafer W is a work surface to be plasma-etched. A protective tape (not shown) may be attached to the front side Wa of the wafer W, so as to protect the devices.

The arm 79 is operated to move the suction pad 70 in a horizontal plane and thereby position the suction pad 70 directly above the wafer W. Thereafter, the arm 79 is lowered in the −Z direction until the holding surface 700a of the suction pad 70 comes into contact with the back side Wb of the wafer W. Thereafter, the vacuum source 71 is operated to apply a vacuum to the holding surface 700a of the suction pad 70, thereby holding the wafer W on the holding surface 700a under suction as shown in FIG. 1.

Thereafter, the transfer means 7 is operated to load the wafer W into the vacuum chamber 6 and set the wafer W on the electrostatic chuck table 3. More specifically, the shutter 62a of the vacuum chamber 6 is opened. Thereafter, the suction pad 70 holding the wafer W under suction is moved through the load/unload opening 62 into the vacuum chamber 6 and then positioned directly above the electrostatic chuck table 3. Thereafter, the suction pad 70 is lowered until the front side Wa of the wafer W comes into contact with the holding surface 31a of the electrostatic chuck table 3. Thus, the wafer W is placed on the holding surface 31a of the electrostatic chuck table 3.

Figure 2:
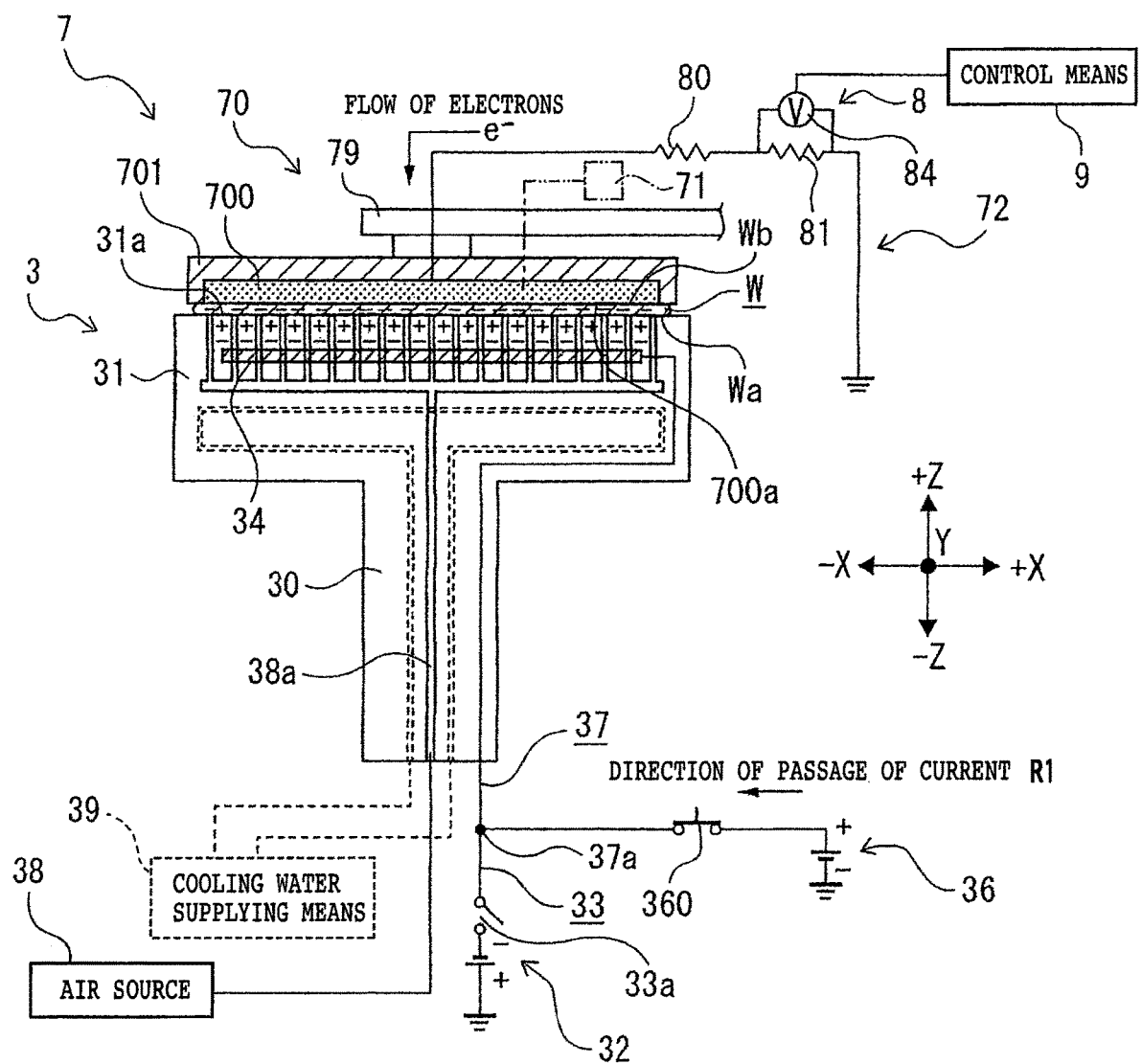
FIG. 2 is a vertical sectional view showing a condition that a conductive suction pad is in contact with a wafer placed on an electrostatic chuck table and a voltage is applied to the electrostatic chuck table to produce an electrostatic holding force for electrostatically holding the wafer on the electrostatic chuck table.

After placing the wafer W on the electrostatic chuck table 3, the switch 360 for the DC power source 36 is turned on as shown in FIG. 2 to supply electric power from the DC power source 36 through the first wiring 37 to the electrostatic chuck table 3. Accordingly, a current is passed in the direction shown by an arrow R1 in FIG. 2, and a predetermined DC voltage (e.g., 5000 V) is applied to the metal plate 34, so that dielectric polarization occurs between the wafer W and a dielectric layer in the wafer holding portion 31 formed above the metal plate 34. Due to this dielectric polarization, positive (+) charge is concentrated in the vicinity of the holding surface 31a of the wafer holding portion 31. Since the electrostatic chuck table 3 and the suction pad 70 are connected with each other through the wafer W, negative (−) charge is supplied through the third wiring 72 and the conductive suction holding member 700 to the wafer W. Accordingly, the wafer W is negatively charged, whereas the holding surface 31a is positively charged. As a result, the wafer W is held on the holding surface 31a by an electrostatic holding force acting between the wafer W and the holding surface 31a. In FIG. 2, the vacuum chamber 6 is not shown.

At this time, a voltage (transient voltage) applied to the resistor 81 of the voltage measuring means 8 in supplying negative (−) charge to the wafer W is measured at both ends of the resistor 81 by using the voltmeter 84. The voltage across the resistor 81 as measured by the voltmeter 84 rapidly rises from a steady-state voltage to a transient voltage. Thereafter, the voltage gradually decreases to restore the steady-state voltage. The control means 9 is connected to the voltmeter 84. Accordingly, information on such a change in the voltage across the resistor 81 is transmitted from the voltmeter 84 to the control means 9. Then, the control means 9 determines the amount of negative charge in the wafer W from the voltage change. Further, according to the amount of negative charge in the wafer W as determined above, the control means 9 determines that the wafer W has been sufficiently negatively charged and therefore reliably held on the holding surface 31a of the electrostatic chuck table 3. This result is then informed to the outside of the apparatus 1 (e.g., to the operator).

After confirming that the wafer W is sufficiently held on the electrostatic chuck table 3, the operation of the vacuum source 71 is stopped to cancel the suction holding of the wafer W by the suction force applied to the holding surface 700a of the suction pad 70. After the wafer W is separated from the holding surface 700a of the suction pad 70, the suction pad 70 is immediately retracted from the vacuum chamber 6 shown in FIG. 1. When the suction pad 70 is retracted from the vacuum chamber 6, the wafer W is not grounded. Since the positive charge in the vicinity of the holding surface 31a of the wafer holding portion 31 is not immediately lost, the charged condition of the wafer W is not immediately canceled. Accordingly, the electrostatic holding force between the holding surface 31a and the wafer W is sufficiently left.

Thereafter, the load/unload opening 62 of the vacuum chamber 6 is closed by the shutter 62a and the evacuating means 64 is next operated to evacuate the vacuum chamber 6. Thereafter, the gas discharge head 2 is lowered and the etching gas is supplied from the reactant gas source 25 to the gas inlet passage 21a formed in the gas discharge head 2. The etching gas supplied to the gas inlet passage 21a is distributed to the plural gas outlet passages 21b and next uniformly discharged from the openings of the gas outlet passages 21b toward the entire surface of the back side Wb of the wafer W held on the electrostatic chuck table 3.

In association with the introduction of the etching gas into the vacuum chamber 6, an RF power is applied from the RF power source 28 to the gas discharge head 2, thereby producing an RF electric field between the gas discharge head 2 and the electrostatic chuck table 3 and dissociating the etching gas to form a plasma. The plasma of the etching gas operates to etch the back side Wb of the wafer W. Further, the wafer W is grounded again due to the production of the plasma, so that the wafer W is kept sufficiently held on the electrostatic chuck table 3.

After suitably performing the plasma etching to the back side Wb of the wafer W, the application of the RF power to the gas discharge head 2 is stopped and the evacuating means 64 is next operated to evacuate the vacuum chamber 6, thereby removing the etching gas from the evacuation opening 64a of the vacuum chamber 6. Thereafter, the shutter 62a is opened to unload the wafer W from the electrostatic chuck table 3 in the vacuum chamber 6 by operating the transfer means 7. At this time, the wafer unloading method according to the present invention is performed to unload the wafer W from the electrostatic chuck table 3. The wafer unloading method includes the following steps.

(1) Voltage Application Stopping Step

Figure 3:
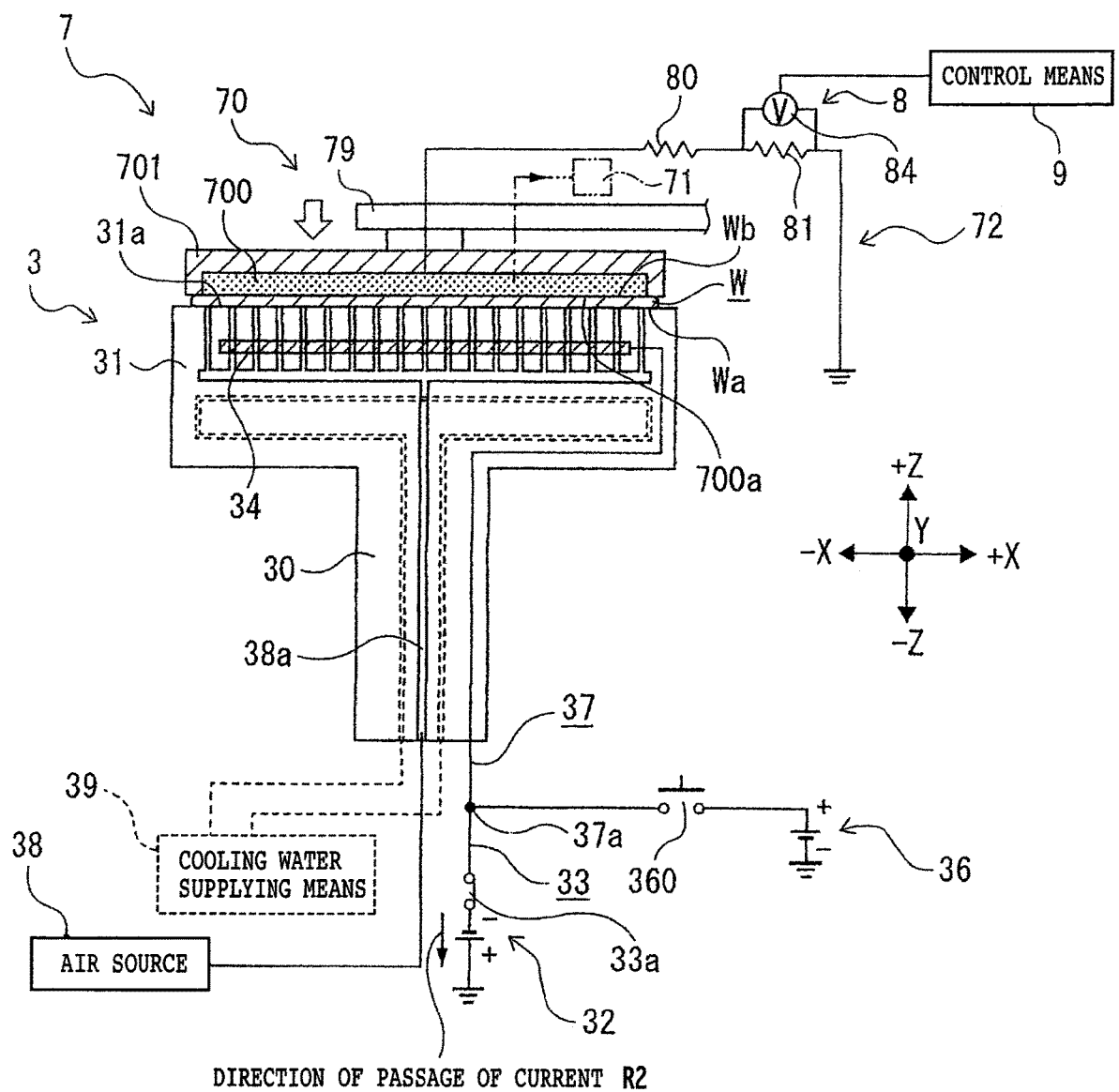
FIG. 3 is a vertical sectional view showing a condition that the conductive suction pad is in contact with the wafer held on the electrostatic chuck table and a static eliminating voltage is applied to the electrostatic chuck table to eliminate static electricity from the electrostatic chuck table.

As shown in FIG. 3, the application of the voltage to the electrostatic chuck table 3 electrostatically holding the wafer W is stopped. More specifically, the switch 36b for the DC power source 36 is turned off to thereby stop the supply of the electric power from the DC power source 36 through the first wiring 37 to the electrostatic chuck table 3. Even when the application of the voltage to the electrostatic chuck table 3 is stopped, the positive (+) charge in the vicinity of the holding surface 31a of the wafer holding portion 31 is not immediately lost, and the negatively charged condition of the wafer W is not immediately canceled.

(2) Suction Pad Contact Making Step

The suction pad 70 is moved to the position directly above the wafer W held on the electrostatic chuck table 3 in the vacuum chamber 6 (not shown in FIG. 3), and the center of the suction pad 70 is made to coincide with the center of the wafer W. Thereafter, the suction pad 70 is lowered until the holding surface 700a of the suction pad 70 comes into contact with the back side Wb of the wafer W held on the electrostatic chuck table 3.

(3) Suction Holding Step

After making the contact of the suction pad 70 with the wafer W as mentioned above, the vacuum source 71 is operated to hold the wafer W on the holding surface 700a of the suction pad 70 under suction as shown in FIG. 3.

(4) Static Eliminating Voltage Applying Step

In raising the suction pad 70 to unhold the wafer W from the holding surface 31a of the electrostatic chuck table 3, there is a possibility of electrification. This phenomenon is called peeling electrification (electrification due to peeling). When peeling electrification occurs, the holding surface 31a of the electrostatic chuck table 3 is positively charged after unholding the wafer W from the electrostatic chuck table 3, and the wafer W unheld from the electrostatic chuck table 3 is negatively charged. To cope with this peeling electrification, the switch 33a is turned on as shown in FIG. 3 to thereby supply electric power from the DC power source 32 through the second wiring 33, the connection point 37a, and the first wiring 37 to the electrostatic chuck table 3. More specifically, a current is passed in the direction shown by an arrow R2 in FIG. 3 and a predetermined DC voltage (e.g., −5000 V) is applied to the metal plate 34 embedded in the electrostatic chuck table 3. That is, the voltage opposite in polarity to the voltage applied in holding the wafer W on the electrostatic chuck table 3 is applied from the DC power source 32 as a static eliminating voltage for canceling the peeling electrification, so that the potential of the electric charge in the vicinity of the holding surface 31a of the electrostatic chuck table 3 is changed from a positive potential to a negative potential. Further, in association therewith, the speed of elimination of static electricity from the wafer W is also increased, so that the negative (−) charge is sufficiently removed from the wafer W. The voltage value of the static eliminating voltage and the duration of application of the static eliminating voltage are adjusted according to the amounts of electric charge remaining in the wafer W and in the electrostatic chuck table 3.

(5) Air Blow Step

Figure 4:
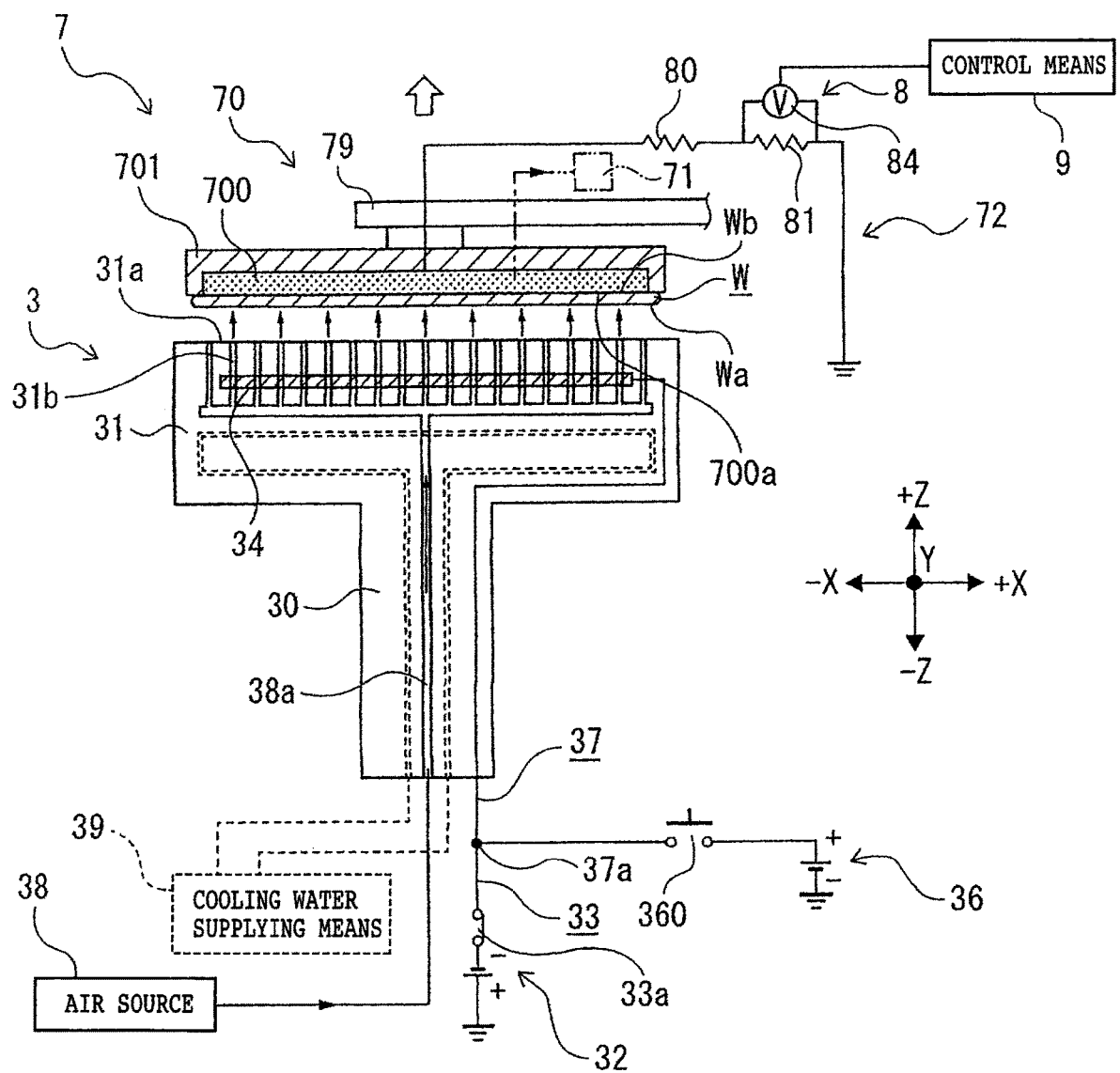
FIG. 4 is a vertical sectional view showing a condition that the static eliminating voltage is kept applied to the electrostatic chuck table and the wafer is unheld from the electrostatic chuck table by operating the suction pad.

After performing the static eliminating voltage applying step, air is supplied from the air source 38 through the air passage 38a to the holding surface 31a of the electrostatic chuck table 3 as shown in FIG. 4, thereby discharging the air from the air discharge ports 31b. Accordingly, the wafer W is pushed up from the holding surface 31a by the discharge pressure of the air. That is, the suction force remaining between the holding surface 31a of the electrostatic chuck table 3 and the wafer W due to vacuum can be removed by the air discharged from the air discharge ports 31b. Accordingly, there is no possibility that the wafer W may be damaged in unholding the wafer W from the electrostatic chuck table 3 in the unholding step to be hereinafter described.

(6) Unholding Step

Thereafter, the suction pad 70 holding the wafer W under suction is raised to unhold the wafer W from the electrostatic chuck table 3 in the condition where the static eliminating voltage is kept applied to the electrostatic chuck table 3. More specifically, the static eliminating voltage is kept applied to the metal plate 34 in the electrostatic chuck table 3, so that the potential of the electric charge in the vicinity of the holding surface 31a of the electrostatic chuck table 3 remains a negative potential. Accordingly, the occurrence of peeling electrification can be suppressed between the holding surface 31a and the wafer W in which the negative (−) charge has been sufficiently removed or still remains. After unholding the wafer W from the holding surface 31a of the electrostatic chuck table 3, the switch 33a for the DC power source 32 is turned off to stop the application of the static eliminating voltage to the electrostatic chuck table 3.

As described above, the wafer unloading method according to the present invention includes the voltage application stopping step of stopping the application of the voltage to the electrostatic chuck table 3 electrostatically holding the wafer W, the static eliminating voltage applying step of passing a current reverse in direction to a current passed to the electrostatic chuck table 3 for electrostatically holding the wafer W, after performing the voltage application stopping step, thereby applying a static eliminating voltage for canceling peeling electrification to the electrostatic chuck table 3, and the unholding step of unholding the wafer W from the electrostatic chuck table 3 in the condition where the static eliminating voltage is kept applied to the electrostatic chuck table 3, after performing the static eliminating voltage applying step. In this wafer unloading method, the static eliminating voltage for canceling the peeling electrification is applied to the electrostatic chuck table 3 before unholding the wafer W from the electrostatic chuck table 3. Accordingly, the electrostatic chuck table 3 is charged with polarity opposite to that of electric charge produced in peeling electrification, so that the occurrence of peeling electrification in unholding the wafer W from the electrostatic chuck table 3 can be prevented. Further, after unholding the wafer W from the electrostatic chuck table 3, the charged condition of the electrostatic chuck table 3 can be canceled. Accordingly, in next holding another wafer W on the electrostatic chuck table 3, a reduction in electrostatic holding force by the electrostatic chuck table 3 can be prevented.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer unloading method for unloading a wafer from an electrostatic chuck table electrostatically holding said wafer by applying a voltage to said electrostatic chuck table, said wafer unloading method comprising:
   a voltage application stopping step of stopping the application of the voltage to said electrostatic chuck table electrostatically holding said wafer;
   a static eliminating voltage applying step of passing a current reverse in direction to a current passed to said electrostatic chuck table for electrostatically holding said wafer after performing said voltage application stopping step so that a static eliminating voltage of said electrostatic chuck table is opposite in polarity to the voltage applied to said electrostatic chuck table for electrostatically holding said wafer, thereby canceling peeling electrification to said electrostatic chuck table; and
   an unholding step of unholding said wafer from said electrostatic chuck table while maintaining said static eliminating voltage applied to said electrostatic chuck table, after performing said static eliminating voltage applying step.

2. The wafer unloading method according to claim 1, wherein said electrostatic chuck table has a holding surface for holding said wafer, an air discharge port opening to said holding surface, and an air passage having one end connected to said air discharge port and the other end connected to an air source;
   said wafer unloading method further comprising an air blow step of discharging air from said air discharge port after performing said static eliminating voltage applying step and before performing said unholding step;
   whereby the air is supplied from said air source through said air passage to said air discharge port and then discharged from said air discharge port toward said wafer held on said holding surface of said electrostatic chuck table.

3. The wafer unloading method according to claim 2, further comprising:
   a suction pad contact making step of making the contact of a conductive suction pad with said wafer held on said electrostatic chuck table before performing said static eliminating voltage applying step; and
   a suction holding step of holding said wafer under suction by using said conductive suction pad, after performing said suction pad contact making step and before performing said air blow step.

4. The wafer unloading method according to claim 1, wherein the polarity of the voltage applied to said electrostatic chuck table in said static eliminating voltage applying step is the same as a polarity of an electrical charge of said wafer.

5. The wafer unloading method according to claim 1, further comprising another voltage application stopping step after said unholding step, of stopping the application of the static eliminating voltage to said electrostatic chuck table.

6. The wafer unloading method according to claim 1, further comprising a step of adjusting a voltage value of the static eliminating voltage and a duration of application of the static eliminating voltage to said electrostatic chuck table based on an amount of electrical charge remaining in said wafer.

* * * * *